United States Patent [19]

Chick

[11] 4,013,904
[45] Mar. 22, 1977

[54] DARLINGTON TRANSISTOR SWITCHING CIRCUIT FOR REACTIVE LOAD

[75] Inventor: Raymond F. Chick, Greensburg, Pa.

[73] Assignee: Westinghouse Electric Corporation, Pittsburgh, Pa.

[22] Filed: Aug. 28, 1975

[21] Appl. No.: 608,479

[52] U.S. Cl. .............................. 307/315; 307/270; 361/91; 357/46

[51] Int. Cl.² .................. H03K 3/26; H03K 17/56; H03K 19/08

[58] Field of Search ................. 307/315, 270, 202; 357/46

[56] References Cited

UNITED STATES PATENTS

| | | | |
|---|---|---|---|
| 3,126,490 | 3/1964 | Stern ................................ | 307/315 |
| 3,210,561 | 10/1965 | Ullman ............................ | 307/315 |
| 3,344,321 | 9/1967 | Sumilas ............................ | 307/315 |
| 3,435,295 | 3/1969 | Ladd, Jr. et al. ................. | 307/315 |
| 3,588,851 | 6/1971 | Jordan, Jr. ....................... | 307/315 |
| 3,829,708 | 8/1974 | Grunleitner et al. ............. | 307/315 |

OTHER PUBLICATIONS

"Of the Darlington Pair" by Walters in Solid State Design, vol. 3, No. 6, June 1962 pp. 47–48.

*Primary Examiner*—Stanley D. Miller, Jr.
*Attorney, Agent, or Firm*—H. W. Patterson

[57] ABSTRACT

A Darlington transistor circuit for switching a reactive load is disclosed. The input transistor is selected to have a sustaining or breakover voltage appreciably less than the output transistor such that the circuit operates with the input transistor in an unclamped mode and the output transistor clamped by the input transistor below its sustaining voltage level to prevent secondary breakdown of the output transistor caused by the swicthing off of the transistor circuit.

10 Claims, 6 Drawing Figures

DARLINGTON TRANSISTOR SWITCHING CIRCUIT FOR REACTIVE LOAD

BACKGROUND OF THE INVENTION

A Darlington transistor circuit, sometimes referred to as a Darlington amplifier or a Darlington pair, is a compound transistor circuit which consists of two transistors in which the collectors are tied together and the emitter of the first or input transistor is directly coupled to the base of the second or output transistor. The emitter current of the input transistor equals the base current of the output transistor. Small current or logic level signals are applied to the base of the input transistor to control high currents in the collector emitter load circuit of the output transistor. The Darlington transistor circuit has the advantage of a much higher current gain compared to a single transistor.

When utilizing the Darlington transistor for switching reactive loads, the removal or reversal of the positive bias on the base of the input transistor shuts off the circuit, while at the same time the reactive load is forcing high power through the output transistor. The load which is in series with the supply voltage tends to force the voltage up to the sustaining or breakover voltage of the output transistor. Reaching this voltage level at high current tends to cause secondary breakdown in the output transistor, and limits the power handling capability of the circuit. When the inductive portion of the load forces the voltage to reach the sustaining voltage of the output transistor, either the transistors are destroyed, if the inductance level of the load is great enough, or such inductance may prolong the turnoff time of the transistor circuit. Thus, the power handling capabilities of the circuit are usually maximized at a voltage level below the sustaining voltage of the transistors.

Heretofore, the power handling capability of the Darlington amplifier was increased by connecting a Zener diode across the collector-base of the input transistor, for example, or across the collector-base of the output transistor, is shown in U.S. Pat. No. 3,435,295, so that the reactive load causes the Zener diode to breakover at the Zener voltage, thereby establishing a maximum voltage across the output transistor.

Other solutions to the problem of secondary breakdown have been proposed; for example, connecting a first resistor between a potential source on the direct connection of the input and output transistor; and a second resistor between the collector electrodes of the input and output transistors, as shown in U.S. Pat. No. 3,210,561. Also it has been proposed to provide an integrating element whose charging and discharging circuits are decoupled; and which is arranged between the collector and base of the transistor in order to permit controlled charging of the integrator when the inductor is first disconnected.

The purpose of the present invention is to provide a Darlington transistor circuit which retains the high gain feature while at the same time substantially increasing the reverse bias safe operating area of the transistor circuit to handle increased loads without requiring extra components to protect the transistor circuit.

SUMMARY OF THE INVENTION

The present invention relates to an improved Darlington transistor circuit. The circuit includes an input transistor and an output transistor. The output transistor collector current is appreciably greater than that of the input transistor; and the input transistor has a collector-emitter sustaining voltage characteristic which is appreciably less than the collector-emitter sustaining voltage characteristic of the output transistor. These characteristics provide increased power handling capability by permitting a supply voltage close to the sustaining voltage of the input transistor and causing the input transistor to clamp any voltage increase which is caused by switching "off" the circuit.

IN THE DRAWINGS

DESCRIPTION OF THE PRIOR ART

Figure 1:
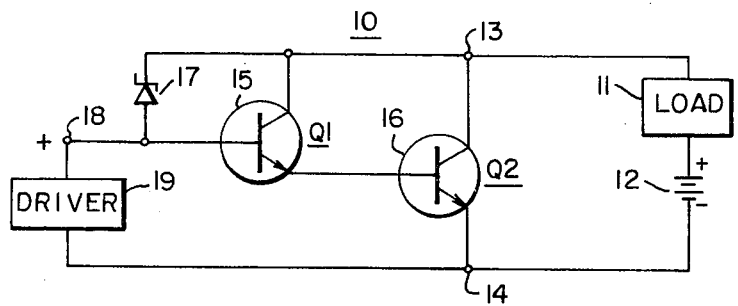
FIG. 1 is a diagram of a Darlington transistor circuit connected to a load; and having a Zener diode connected to the input transistor in order to increase the power handling capability of the circuit in accordance with the teachings of the prior art.

Referring to FIG. 1, a Darlington transistor circuit 10 is shown to have a reactive load generally referred as 11 in series with a voltage source 12 connected across output terminals 13 and 14. An input transistor 15, designated as Q1 has its emitter connected to the base of output transistor 16 designated as Q2. A Zener diode 17 has its cathode connected to the collector of the transistors 15 and 16; and its anode connected to the base of the input transistor 15. The switching or driving signal for the transistor circuit 10 is applied from a source 19 at a terminal 18 connected to the base and emitter of the input transistor 15.

When the Darlington transistor circuit 10 is turned "on" by biasing the base of the transistor Q1 positive with respect to its emitter, current flows between the collector and the emitter of the transistor Q2, which completes the circuit for operating the load 11 from the power source 12. The high current gain of the transistor Q2 combined with the lower current gain of the transistor Q1 provides the total current gain of the Darlington circuit in accordance with the following formula:

$$h_{FE}(\text{Darlington}) = h_{FE}(Q1) \times h_{FE}(Q2) + h_{FE}(Q1) + h_{FE}(Q2).$$

Thus, when turning "on" the transistor circuit 10, the current through the transistor Q1 collector-emitter is in the order of one ampere, for example; and the current across the transistor Q2 is in the order of 10 amperes, for example. In response to applying a turn "off" signal to the base; that is, reverse biasing the base-emitter electrodes of the transistors Q1 + Q2, any inductive component in the reactive load attempts to force the load current to continue flowing through the transistor circuit 10. This raises the voltage across the transistors Q1 and Q2 in an attempt to keep that current flowing. The inductive energy stored during the "on" cycle must be dissipated. Thus, the Zener diode 17 begins to conduct when the voltage across the collector emitter of the transistors Q1 and Q2 increase to the Zener voltage. The conducting of the Zener diode 17 applies current to the base of the transistor Q1, which in turn applies current to the base of the transistor Q2 through the collector emitter of Q1. Thus, the Zener clamps the maximum voltage to the Zener voltage each time that the transistor turns off provided that the stored inductive energy is sufficient. Thus, by supplying a base drive through the Zener diode at the Zener voltage, current is conducted through the series connected base emitters of the transistors which results in operating the transistor circuit 10 in a forward biased mode which increases its power handling capability. Without the Zener diode, the inductive portion of the load may force the emitter-collector voltage to the sustaining voltage of the transistor Q2, and at some critical energy level cause the transistor to be destroyed. Therefore, the utilization of the Zener diode as shown herein, provides for clamping the transistor circuit 10 and enabling it to handle a power level that it wouldn't otherwise be able to handle, without destroying itself. With the prior art device, most of the power is still going through the transistor circuit 10, but the difference lies in the fact that the Zener diode clamp has turned on the transistor giving it some forward bias at the level while it is dissipating the stored energy. During turn off, the base drive is coming through the Zener diode to supply base emitter current while clearing the energy out of the load. When reversing the polarity of the base of the transistor Q1 in an attempt to turn "off" the transistor circuit 10, which applies positive voltage to the emitter junction 14 and negative to the base 18, at the same time the load is forcing a higher power across the collector and emitter of the transistor Q2 which restricts the load current flow to a small part of the total chip area of the transistor Q2. Since the transistor Q1 at its collector junction is dissipating approximately a tenth of the power that the transistor Q2 is handling, it is more likely that the output transistor Q2 is the one that fails.

Figure 2:
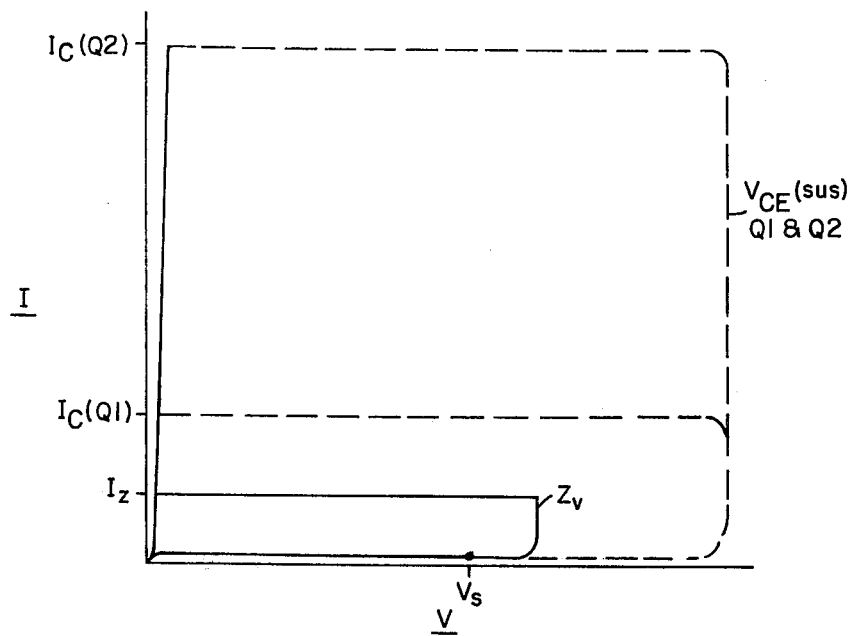
FIG. 2 is a graph showing the operation of the Darlington circuit of FIG. 1.

Referring in more detail to the operation of the prior art device 10 of FIG. 1, reference is made to the graph of FIG. 2 which shows the relationship between the Zener voltage $Z_v$ and the sustaining voltage $V_{CE}$ of the transistors Q1 and Q2. The $V_{CE}$ (sus) for Q1 and Q2 and the Zener voltage are shown as they would appear if measured separately; that is, before completing the common electrical connection between the collectors of Q1, Q2 and the Zener 17. The Zener voltage $Z_v$ is slightly greater than the supply voltage $V_s$ which drives the load 11 (FIG. 1). Assuming that the output transistor Q2 is conducting 10 amperes of current, and the positive base drive is reversed in polarity, a large enough inductance L will cause the voltage to increase at 10 amperes until it reaches the Zener voltage $Z_v$ at which point the power is dissipated at such Zener voltage. The voltage never reaches the sustaining voltage $V_{CE}$ as represented by the dashed line of FIG. 2, thus protecting the transistors and permitting them to operate at a higher power level.

DESCRIPTION OF PREFERRED EMBODIMENTS

Figure 3:
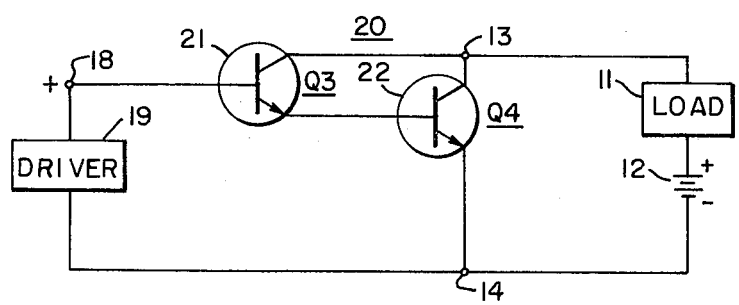
FIG. 3 is a diagram of one embodiment of a Darlington circuit according to the present invention connected to a typical load.
Figure 4:
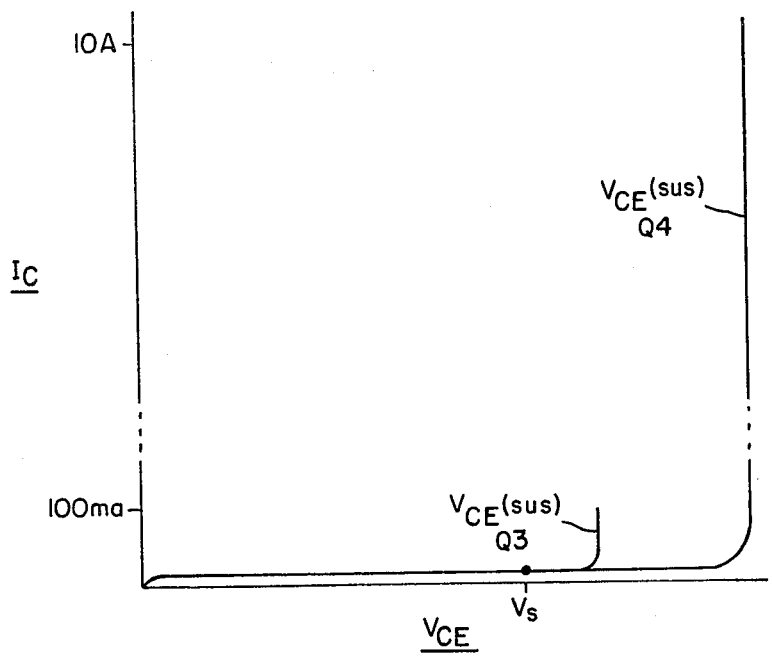
FIG. 4 is a graph illustrating a key feature of the transistor in the improved Darlington circuit of the present invention.

Referring to FIG. 3, a Darlington transistor circuit 20 is illustrated which provides the same power handling capability as the Darlington circuit referred to generally as 10 in FIG. 1 which included the Zener diode 17 connected between the base and the collector of the transistor Q1. An input transistor 21, designated as Q3 is driven to an "on" state by a positive pulse applied to the terminal 18 from the driver 19, and turns "on" an output transistor 22, designated Q4, which has its base directly coupled to the emitter of the transistor 21. A load 11 in series with a voltage supply 12 is connected across the collector emitter terminals of the output transistor Q4. The gain of the transistors Q3 and Q4 may bear the same relationship as the transistors Q1 and Q2 of the Darlington circuit 10. For example, the gain of transistor Q3 may be ten times that of the transistor Q4, and provide one ampere collector current for Q3 while the collector current of the transistor Q4 may be 10 amperes. In normal practice the collector current of Q4 could vary from 10 to 30 amperes, for example; and the collector current of the transistor Q3 could vary from a 100 milliamperes to 1 ampere. These current ranges can be scaled up or down depending on the device chip sizes. The significant difference between the devices 10 and 20 involves the relative sustaining voltage characteristics of the transistors Q3 and Q4. The sustaining voltage of both the transistors Q3 and Q4, of course are higher than the supply voltage $V_s$. However, the sustaining voltage of the transistor Q3 is appreciably less than the sustaining voltage of the output transistor Q4. Or in other words, the sustaining voltage of the transistor Q4 is appreciably higher than the sustaining voltage of the transistor Q3, which, as a minimum, must be slightly higher than the supply $V_s$. The different sustaining voltage levels in FIG. 4 are shown as they would appear for transistors Q3 and Q4 if the transistors were measured separately, that is without the interconnecting between the two collectors. When the collectors are interconnected, only one sustaining voltage can be measured across 13 and 14 of FIG. 3; that is the $V_{CE}$(sus) of Q3 plus the $V_{BE}$ of Q4. For most high power circuits the $V_{BE}$ of Q4 will be much less than the $V_{CE}$(sus) of Q3. Thus the sustaining voltage for the Darlington is essentially the $V_{CE}$(sus) of Q3. In contrast to the prior art, the sustaining voltages of both the transistors Q1 and Q2 were approximately equal (see FIG. 2).

Figure 5:
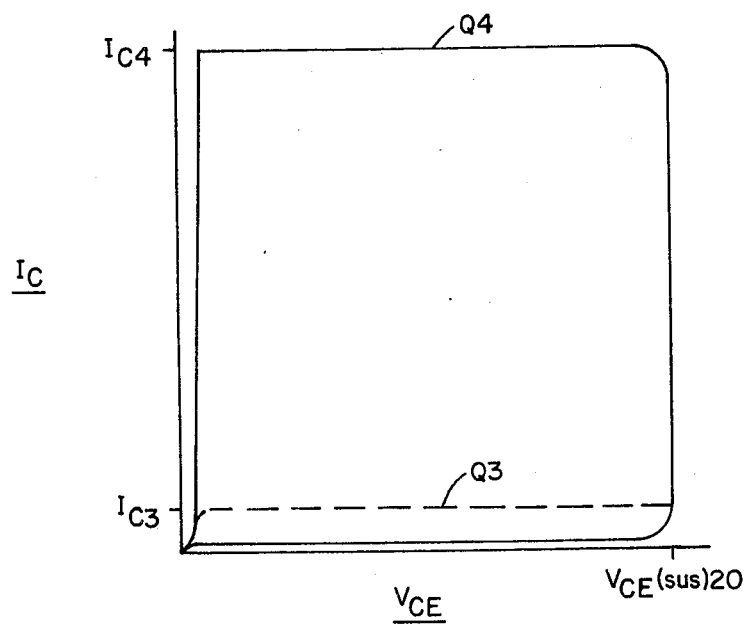
FIG. 5 is a graph illustrating the operation of the improved Darlington circuit of the present invention.

The difference in operation between the devices of FIG. 1 and FIG. 3 occurs when the circuit 20 is switched "off" and the inductive portion of the reactive load is attempting to force current to continue to flow through the transistors Q3 and Q4. At the point that the load voltage increases at turnoff; that is, at the instance of turnoff, the voltage across the input transistor Q3 increases until it reaches the sustaining voltage of that device (see FIG. 5). At such point, it conducts current independent of the base drive in a manner similar to the conduction of the Zener diode 17 at its Zener voltage. The transistor Q3 conducts current $I_{C3}$ (FIG. 5) which flows through the base and emitter of the transistor Q4 which biases the transistor Q4 "on". At the same time, the voltage between the base and collector of the transistor Q4, is held at the breakover or sustaining voltage of Q3, so that the collector-base of the transistor Q4 is now clamped at the sustaining voltage of the transistor Q3. The transistor Q4 is supplied with a small amount of current at its base such that it carries the main portion of the load current $I_{C4}$ (FIG. 5) through its collector and emitter while maintaining the sustaining clamp voltage level of the transistor Q3 as shown in FIG. 5. In this manner, most of the load energy is dissipated through the transistor Q4, while maintaining the transistor Q4 below its sustaining voltage. Although the transistor Q3 is operated at its sustaining voltage upon the turning "off" of the Darlington circuit; it is operating at a much lower current level $I_{C3}$ than the transistor Q4 would be operating. Thus, it can handle the power needed to clamp the transistor Q4 and render it feasible for such a transistor with a lower sustaining voltage to handle the unclamped power while using it as a protection device for Q4 which is handling the bulk of the power.

The transistor Q3 turns off when the inductive energy portion of the load can no longer maintain the sustaining voltage of Q3. The transistor Q4 then turns off with the exception of a small leakage current flow. The turn off time of the transistor may be anywhere from less than one microsecond to twenty or thirty microseconds, for example.

In actual practice, the difference between the sustaining voltages of the transistors Q4 and Q3 should be somewhere in the neighborhood of twenty-five percent; that is, if the sustaining voltage of Q3 is 75 volts, then the sustaining voltage of Q4 should be approximately 100 volts. This twenty-five percent margin between the sustaining voltage of the transistor Q4 and the clamping voltage of the transistor Q3 adequately assures the sustaining voltage of Q4 is never reached. The sustaining voltage of Q3 could be lower than twenty-five percent of the sustaining voltage of Q4, but this would merely restrict the transistor circuit 20 to a lower maximum voltage rating. The difference between these sustaining voltages should be based on the sustaining voltage characteristics for particular device design. As the clamping voltage goes down for the transistor Q3, the blocking voltage of the device 20, of course, is reduced. The sustaining or clamping voltage of the transistor Q3 could be closer to the sustaining voltage of Q4 depending on the type of reactive load existing at 11. For some applications a difference of less than twenty-five percent may be considered good design.

The sustaining voltage of the transistor Q3 is utilized to drive the transistor Q4 in response to the shutting off of the base drive at the terminal 18 with an inductive load. Thus, we are concerned with the collector-emitter sustaining voltage of the transistor Q3 with the current flowing through the base emitter in a forward direction, which is the main mode of operation during the critical turn off period of the base drive. The output transistor Q4 is receiving base drive from the input transistor Q3 while Q3 is in the sustaining voltage region; that is, with Q4 forward biased at some value of base drive.

Assuming adequate positive base drive is applied to the base of the transistor Q3, Q3 collector current will increase to 100 milliamps, and by virtue of the gain of the transistor Q4, the 100 milliamp base drive into Q4 will provide us with 10 amps of collector current for Q4. When the base drive is either removed, or switched to a negative polarity to turn the transistors Q3 and Q4 off, the inductive nature of the load forces that current to remain relatively constant. However, the voltage increases until it reaches $V_{CE}$ which is the sustaining or clamping voltage of the transistor Q3 (see FIG. 4) at the same time the transistor Q4 is increasing in voltage at the 10 ampere level then Q4 is clamped at the same sustaining voltage level as Q3, which provides a margin between the original unconnected sustaining voltage of Q4 and the clamp voltage obtained with inductive loads as the energy is dissipated therefrom. As such energy is dissipated, the transistors Q3 and Q4 return from a high voltage high current point of operation along the clamped or sustaining voltage of Q3 down to the actual supply voltage $V_s$. At the actual supply voltage $V_s$, the circuit is at rest and the Darlington transistor is completely off.

Thus, in summary, an improved Darlington transistor circuit is described which retains the high gain feature and substantially increases the reverse bias safe operating area. By selecting the sustaining voltage for the transistors Q3 and Q4 as previously described, the Darlington circuit 20 operates without an external clamping device or circuit for reactive loads and therefore dissipates power in the sustaining voltage region of the transistor Q3. However, the power dissipated by Q3 is much less than that for Q4 although both are operating at the same voltage. The power of the transistor Q3 is approximately equal to the power dissipation divided by the gain of the transistor Q4. Thus, if the transistor Q4 has a minimum gain of 10 at its peak collector current, then the power for the transistor Q3 is approximately one tenth of the total power dissipation for the Darlington circuit. A significant increase in safe operating limits is achieved because the transistor Q4 is always clamped below its sustaining voltage level while the transistor Q3 operates in the unclamped mode at approximately one tenth of the total power dissipated in the Darlington circuit.

Also, the improved Darlington transistor circuit not only eliminates an external component or circuit to clamp the transistor, but it also eliminates additional capacitance, and/or recovery time of the clamping device which would make the prior art Darlington switch slower. For example, the Zener diode has capacitance, and for certain applications, a fast switching diode is placed in series with the Zener to improve the circuit response.

In one actual reduction to practice, double epitaxial transistors were used for the transistors Q3 and Q4. For example, a conventional Westinghouse 1814 high voltage NPN double epitaxial silicon power transistor was utilized for the transistor Q3 that had a collector emitter sustaining voltage of approximately 250 volts with a maximum peak collector current of 10 amperes. The transistor Q3 had an emitter base voltage of a 7 volt maximum and a continuous base current of 3 amps. And the maximum power dissipation of such transistor is 44 watts. For the transistor Q4, a conventional Westinghouse type 1843 NPN double epitaxial high voltage silicon power transistor was used that had a sustaining voltage of approximately 300 volts.

Although the epitaxial transistors were found satisfactory, it is contemplated that a Darlington circuit according to the present invention may be achieved with any process where separate chips are used for the transistors Q3 and Q4. Also, it is contemplated that a triple diffused process may be modified to produce a single chip with the transistor Q3 having a lower collector emitter sustaining voltage than the transistor Q4.

Figure 6:
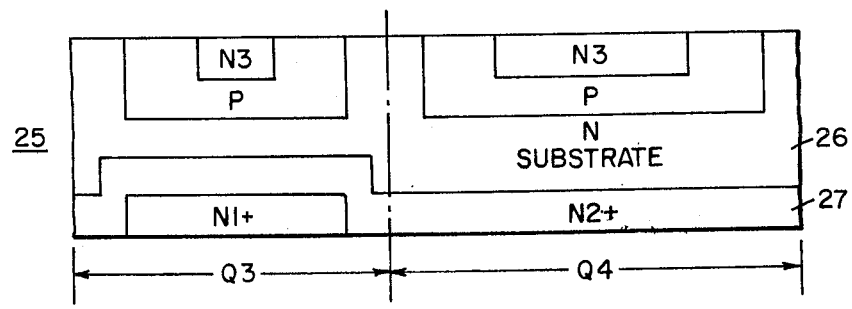
FIG. 6 is a diagram illustrating the method of manufacturing a triple diffused mesa-type Darlington circuit device of the present invention.

Referring to FIG. 6, a single chip Darlington transistor is referred to generally at 25. The starting material is a relatively high resistivity, N-type silicon substrate, referred to at 26. The collector diffusion for Q3, referred to at N1+ is performed while masking the Q4 portion of the chip. A second diffusion N2+ is then performed on the total area 27 to form the collector region of Q4 and the composite collector region of Q3 designated as N1+ and N2+. The N2+ diffusion is similar to that performed on a conventional triple diffused structure to reduce the collector saturation resistance. The two steps of collector diffusion provide the desired margin between the sustaining voltages of Q3 and Q4. The geometry for the base regions of Q3 and Q4 is achieved by masking, depositing base deposit impurity, and finally, forming the P-layers during the third diffusion step.

A fourth diffusion of relatively high impurity dopant is accomplished through a mask to form the emitter regions N3 for Q3 and Q4. Ordinarily the area for transistor Q3 will be smaller than that for Q4 because it conducts less current, and the emitter-base geometry of Q3 and Q4 may be different, although not indicated in FIG. 6.

Although a single embodiment of the invention has been described, it is contemplated that variations may be made either in the relationship of the sustaining voltages or the parameters for the application in which such Darlington circuit is used. Also, PNP transistors may be used instead of NPN.

What is claimed is:

1. A transistorized switching circuit for a reactive load, comprising an input transistor and an output transistor, each said transistor having a base, emitter, and collector electrodes, said input transistor being directly electrically coupled at its emitter electrode to the base electrode of the output transistor, means for connecting a predetermined switching voltage to the base and emitter electrode of the input transistor, means for connecting electrically a reactive load in series with a supply voltage source across the collector and emitter electrode of the output transistor, said input transistor structured to have a collector-emitter sustaining voltage substantially less than the collector-emitter sustaining voltage of the output transistor said sustaining voltages being of sufficient difference that the input transistor collector-emitter clamps any reactive load voltage to the sustaining voltage of the input transistor and prevents power dissipation at the sustaining voltage of the output transistor, and the sustaining voltage of the output transistor is the disconnected common connection of the input and output transistor collectors.

2. A circuit according to claim 1 wherein the input transistor has a sustaining voltage in the neighborhood of seventy-five percent of the sustaining voltage of the output transistor.

3. In combination, a first and second transistor, each said transistor having a base, emitter, and collector electrode, the emitter electrode of the first transistor being directly electrically coupled to the base electrode of the second transistor, the collector electrodes of the first and second transistors being electrically coupled, a reactive load, a supply voltage source connected in series with the reactive load, said reactive load and supply voltage being electrically coupled across the collector electrodes and emitter electrode of the second transistor, a switching voltage source electrically coupled across the base and emitter electrodes of the first and second transistors, said first transistor being structured to have a higher gain than the second transistor, and said first transistor having a collector-emitter sustaining voltage substantially less than the collector-emitter sustaining voltage of the second transistor, said supply voltage being slightly less than the sustaining voltage of the first transistor, said difference between the input and output transistor sustaining voltages being such that the reactive load voltage does not reach the sustaining voltage level of the second transistor in response to the shutting "off" of the switching voltage for the first transistor.

4. A combination according to claim 3 wherein the first transistor has a sustained voltage in the neighborhood of seventy-five percent of the sustaining voltage of the second transistor.

5. A combination according to claim 3 wherein the reactive load has an inductive portion.

6. A Darlington transistor circuit, comprising an input transistor and an output transistor, each said transistor having a base, emitter, and collector electrodes, said input transistor being directly electrically coupled at its emitter to the base of the output transistor, said input and output transistors being electrically commonly coupled at their collector electrodes, means for connecting the base of the input transistor and emitter of the output transistor to a predetermined switching voltage, and means for connecting the commonly coupled collectors and the emitter of the output transistor to a load and supply voltage, said input transistor being structured to have a collector-emitter sustaining voltage substantially less than the collector-emitter sustaining voltage of the output transistor, whereby the input transistor clamps the transistor circuit at the sustaining voltage of the input transistor to prevent secondary-breakdown of the output transistor caused by the inductive portion of a load in response to the shutting off of the transistor circuit.

7. A Darlington transistor circuit for switching a reactive load, comprising an input transistor, an output transistor, said input transistor having a gain greater than the output transistor, each said transistor having a base, emitter, and collector, the emitter of the input transistor being coupled electrically to the base of the output transistor, the collector of the input and output transistors being commonly coupled electrically, means for connecting the emitter of the output transistor and the commonly coupled collector to a reactive load and a power source connected in series with the load, means for connecting the base of the input transistor and the emitter of the output transistor to a control signal source for biasing the base of the input transistor in response to a control signal to cause the input and output transistors to conduct, said input transistor structured to have a collector emitter sustaining voltage less than the collector-emitter sustaining voltage less than the collector-emitter sustaining voltage of the output transistor sufficient that upon cessation of the base bias applied to the input transistor, the reactive voltage through the circuit is clamped to the sustaining voltage of the input transistor to prevent secondary breakdown of the second transistor.

8. A Darlington transistor circuit according to claim 1 fabricated on a single silicon chip.

9. A Darlington transistor circuit according to claim 6 fabricated on a single silicon chip.

10. A Darlington transistor circuit according to claim 7 fabricated on a single silicon chip.

* * * * *